FIG. 1
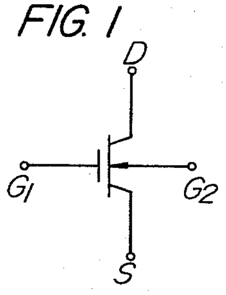
FIG. 2
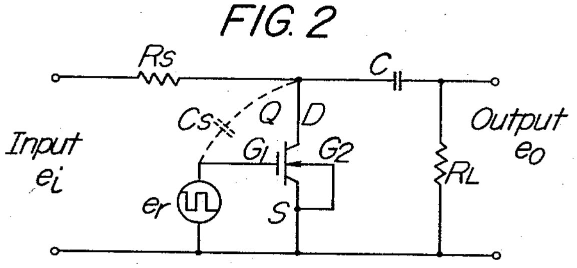
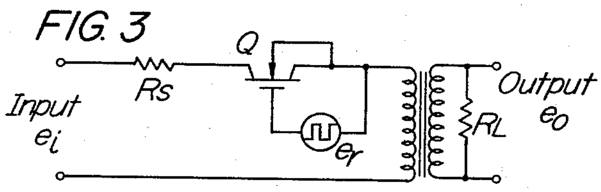
FIG. 4
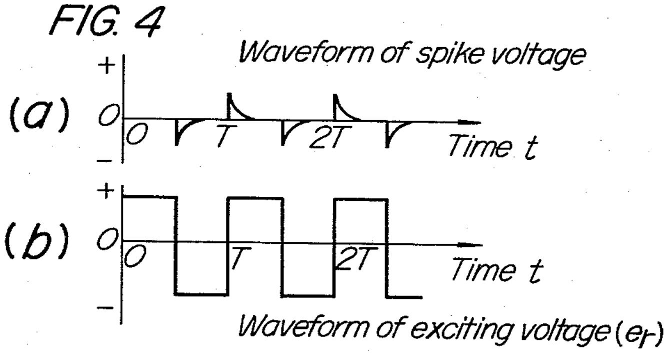
FIG. 5
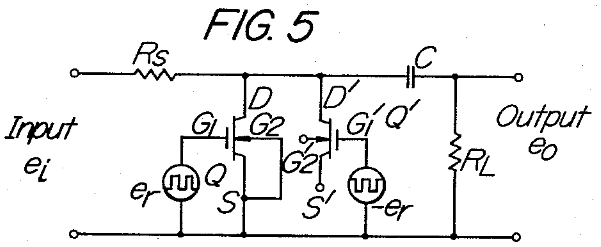
INVENTOR
SHINICHI OHASHI
MASAHARU KUBO
TOSHIJIRO TAKAGI
ZENMON ABE
MINORU ONO
BY Paul M. Craig, Jr.
ATTORNEY

SEMICONDUCTOR MODULATOR

Filed April 1, 1966 2 Sheets-Sheet 2

INVENTOR
SHINICHI OHASHI
MASAHARU KUBO
TOSHIJIRO TAKAGI
ZENMON ABE
MINORU ONO

BY Paul M. Craig, Jr.
ATTORNEY

United States Patent Office 3,363,166

Patented Jan. 9, 1968

3,363,166
SEMICONDUCTOR MODULATOR

Shinichi Ohashi, Kodaira-shi, Masaharu Kubo, Kokubunji-shi, Toshijiro Takagi, Tokyo, Zenmon Abe, Kokubunji-shi, and Minoru Ono, Kodaira-shi, Japan, assignors to Hitachi, Ltd., Tokyo, Japan, a corporation of Japan Filed Apr. 1, 1966, Ser. No. 539,486
Claims priority, application Japan, Apr. 3, 1965, 40/19,328
7 Claims. (Cl. 321—44)

The present invention relates to a modulator employing a MOS field effect transistor and its object is to provide a modulator, the offset voltage thereof being compensated for by the output from the compensation voltage source through an inter-electrode capacity.

A conventional semiconductor modulator (DC-AC inverter) employs an element such as a common junction transistor, diode or the like as a switching element. Either of such elements as a p-n junction, and consequently the generation of fairly large offset voltage and drift voltage is unavoidable owing to contact potential difference and backward leakage current at this p-n junction. The inventor of the present application previously proposed therefor, a novel semiconductor modulator in which the offset voltage caused by p-n junctions is not generated by employing a MOS transistor as a switching element. Therefore, the MOS transistor can be used as a modulator of very weak signals, but there still remains an offset voltage caused by electrostatic coupling through interelectrode capacity from an exciting voltage source. This invention offers an effective compensation method of the offset voltage and its variation, that is, drift voltage.

Features and advantages of the present invention will become more apparent from the following detailed description when taken in conjunction with the accompanying drawings, in which:

FIG. 1 is a symbolic diagram of a MOS field effect transistor;

FIGS. 2 and 3 are modulator circuit diagrams employing said transistor;

FIG. 4 is waveforms of an exciting voltage and a spike voltage;

FIGS. 5 and 10 are circuit diagrams of embodiments of the invention;

Figure 6:
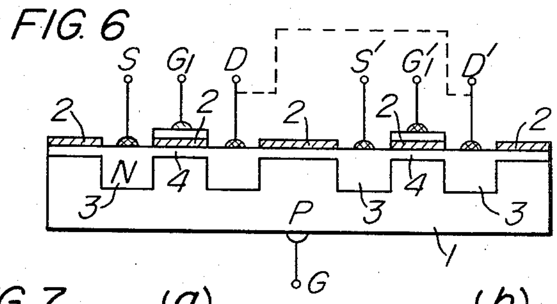

FIGS. 6 and 7*a* are sectional views of transistor portions in modulators according to the invention;

FIG. 7*b* is a plan view of FIG. 7*a*; and

Figure 8:
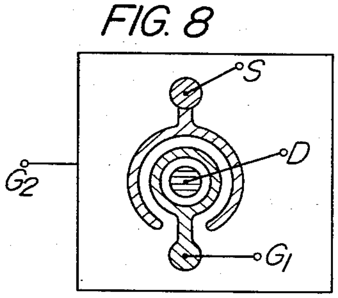
Figure 9:
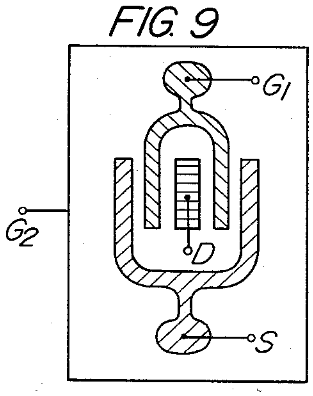

FIGS. 8 and 9 are plan views of transistors having different electrode structures.

Now referring to FIG. 1, $G_1$ and $G_2$ designate respectively first and second gate electrodes, D designates drain electrode, and S designates source electrode. In such a transistor, as is well known, the conductance between D and S is controlled by the voltage applied between $G_1$ and S or between $G_2$ and S. Consequently, the MOS transistor can be used as a switching element which is controlled by the voltage source applied to $G_1$–S or $G_2$–S. When the said voltage is high enough, the conductance of the MOS transistor is high and the switch is ON state and low enough to make the conductance low (the switch is OFF state).

FIG. 2 illustrates a modulator circuit employing the field effect transistor shown in FIG. 1. A DC input signal $e_i$ is modulated by the frequency of an exciting source voltage $e_r$ applied between the first gate electrode $G_1$ and the source S, and a modulated signal $e_o$ appears at the terminals of a load resistor $R_L$ through a coupling condenser C. $R_s$ represents a source impedance.

Although the transistor Q for switching use was connected in parallel with a signal source in the example of FIG. 2, it can be connected in series as shown in FIG. 3 or can be the combination thereof. However, the following description will be made with reference to a modulator having a circuit construction as shown in FIG. 2 for the sake of convenience.

In such a modulator, the exciting voltage is electrostatically induced to a load through an interelectrode capacity between the first electrode $G_1$ and the drain electrode D and a stray capacity $C_s$. Since the stray capacity $C_s$ is usually a few picofarad or less, the exciting voltage of a waveform as shown in FIG. 4*b* is differentiated to become spike voltages as shown in FIG. 4*a*. The magnitudes of positive and negative spike waves (integrated values with respect to time) with reference to the zero level are different from each other, and which becomes an equivalent DC offset voltage.

An embodiment of the present invention for diminishing the above-mentioned offset voltage is shown in FIG. 5. A MOS field effect transistor Q′ of the same characteristics as the switching transistor Q is connected in parallel with the transistor Q, and a voltage source $-e_r$ of opposite phase to that of the exciting voltage source $e_r$ is connected between the first gate electrode of the transistor Q′ and a signal transmission line.

In FIG. 5, the spike voltage of the switching transistor Q is cancelled by the spike voltage having the opposite phase thereto of the compensating transistor Q′, resulting in no or at least a very low offset voltage. Moreover, since the said two inter-electrode capacitors are both MOS capacitors and follow the same characteristics, and since the temperature characteristics thereof are also equal to each other, the variation of the offset voltage with temperature is very small.

According to the experimental results of the inventors, the drift voltage of the circuit of FIG. 2 was, when $R_s$=1MΩ, 10 μv./° C. or so, whereas that of the modulator of the invention shown in FIG. 5 was 0.1 μv./° C. or so.

Figure 10:
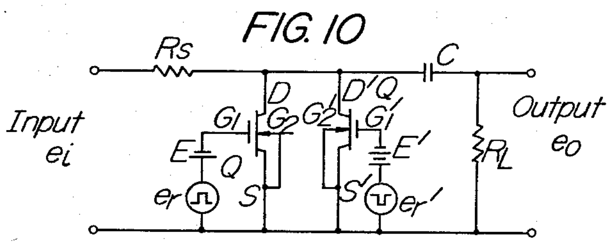

FIG. 10 shows another embodiment of the invention wherein E and E′ designate DC bias voltage sources respectively applied to gates G and G′ of transistors Q and Q′, and E′ is assumed to be of sufficiently negative value for keeping the transistor Q′ continually in off state. In such a case, the capacity between $G_1$–D of the transistor Q and the capacity between $G_1'$–D′ of the transistor Q′ are nearly equal, and hence the amplitudes of electric sources $e_r$ and $-e_r$ can be made nearly equal. Against this, in the aforementioned embodiment of FIG. 5, although the bias source E′ is unnecessary, the capacity among $G_1'$–S′–D′ exists in parallel with the capacity between $G_1'$–D′, and consequently the amplitude of the source $-e_r$ may very well be small when compared with that of the source $e_r$.

By either one of the above-mentioned methods a fair spike compensation is possible, and also in the series type modulator circuits as shown in FIG. 3, the spike compensations are also possible by means of similar methods.

In the practical construction of a modulator of the invention, separate transistors may be used as transistors for switching and compensation. Since several field effect transistors can be constructed on a single substrate easily, a device of the invention can readily be realized in very small size.

FIG. 6 shows an example of such a construction, which has been formed as follows. First, one surface of a P type silicon substrate is oxidized to form a silicon oxide film 2. Then, the oxide film 2 is removed and N-type semiconductor is doped at portions corresponding to the drains D and D′ and the sources S and S′. The conductivity type of the portions of the substrate 1 directly under the oxide film 2 was inverted at the time of formation of said oxide film to form a very thin N-type layer. To the oxide film existing between said S–D and between said S′–D′, a first gate electrodes $G_1$ and $G_1'$ are attached respectively, and to a portion of the p type semiconductor substrate, a second gate electrode $G_2$ is connected. A transistor having the electrodes S, $G_1$, D and $G_2$ is used for switching, and a transistor having the electrodes S′, $G_1'$ and D′ is used for offset compensation.

As has already been stated, a spike voltage appearing at the drain electrode D from the first gate electrode $G_1$ through the oxide film capacitor is cancelled by a spike voltage appearing at the drain electrode D′ from the first gate electrode $G_1'$ of the compensating transistor through the oxide film.

Figure 7:
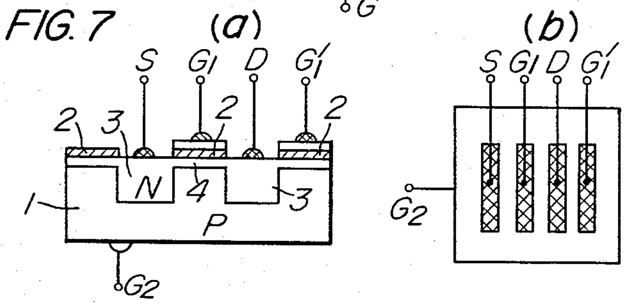

In the above case, regarding the transistor for compensation use, only the interelectrode capacity between the first gate electrode $G_1'$ and the drain electrode D′ thereof is utilized, and hence the other electrodes may be omitted, an example of which is shown in FIG. 7, wherein the gate electrode $G_1'$ is provided at the position symmetrical to the electrode $G_1$ with respect to the drain electrode D. In this case also, exactly the same effect as in the above case obviously results.

As practical electrode structures there are a variety of shapes such as those of bar shape as shown in FIG. 7, of ring shape as shown in FIG. 8, of horse shoe shape as shown in FIG. 9 and the like, in either case of which the spike compensation is possible in principle. Since a field effect transistor is such that it acts as a switching element even if an exciting voltage is applied between the first gate electrode $G_1$ and the drain electrode D, in the devices shown in various figures the electrodes S and D can be interchanged. Although the above description has been made with reference to MOS field effect transistors, it is likewise applicable to other insulated gate field effect transistors.

As evident from the above description, the present invention is such that in a modulator utilizing an insulated gate field effect transistor as a switching element, an offset voltage derived through interelectrode capacity is compensated for by the use of the same kind of field effect transistor. Such transistors can easily be formed on the same substrate in multiplicity, and consequently the construction thereof is very compact and simple, and, moreover, has nearly equal and good compensation effect even if the ambient temperature is varied.

What is claimed is:

1. A semiconductor modulator characterized by a switching insulated gate field effect transistor having gate electrode, source electrode and drain electrode, an exciting voltage source connected to said gate electrode and one of the remaining electrodes, an input signal source connected between said source electrode and drain electrode, a load impedance to which the output of said input signal chopped with the frequency of said exciting voltage source is fed, an offset compensating semiconductor device having the same kind of junction as the junction between said gate electrode and one of said remaining electrodes of said switching transistor, and an auxiliary voltage source having the phase opposite to the voltage of said exciting voltage source, said offset compensating semiconductor device and said auxiliary voltage source being connected in series between said source electrode and said drain electrode of said switching transistor.

2. A semiconductor modulator according to claim 1. characterized in that said offset compensating semiconductor device comprises the same kind of insulated gate transistor as said switching transistor.

3. A semiconductor modulator according to claim 2, characterized in that a negative bias voltage is applied to the gate electrode of each insulated gate transistor in order to equalize the interelectrode capacity between the gate electrode and one of the remaining electrodes of said transistors to each other.

4. A semiconductor modulator according to claim 1, characterized in that said offset compensating semiconductor device and said switching transistor are formed on the same substrate.

5. A semiconductor modulator according to claim 2, characterized in that said offset compensating semiconductor device and said switching transistor are formed on the same substrate.

6. A semiconductor modulator according to claim 1, characterized in that said switching transistor is connected in parallel with said load.

7. A semiconductor modulator according to claim 1, characterized in that said switching transistor is connected in series with said load.

References Cited

UNITED STATES PATENTS

| | | | |
|---|---|---|---|
| 3,229,190 | 1/1966 | Morrison et al. | 321—45 |
| 3,229,218 | 1/1966 | Sickles et al. | 330—29 |
| 3,246,173 | 4/1966 | Silver | 307—88.5 |
| 3,281,718 | 10/1966 | Weberg | 307—88.5 |

JOHN F. COUCH, *Primary Examiner.*

W. M. SHOOP, Jr., *Assistant Examiner.*